United States Patent
Tsai et al.

[11] Patent Number: 6,110,801
[45] Date of Patent: Aug. 29, 2000

[54] METHOD OF FABRICATING TRENCH ISOLATION FOR IC MANUFACTURE

[75] Inventors: Chung-Shih Tsai, ChiaYi; Der-Tsyr Fan, Taipei, both of Taiwan

[73] Assignee: Mosel Vitelic Inc., Hsinchu, Taiwan

[21] Appl. No.: 09/190,284

[22] Filed: Nov. 13, 1998

[30] Foreign Application Priority Data

Sep. 4, 1998 [TW] Taiwan ................................. 87114671

[51] Int. Cl.[7] .................................................. H01L 21/76
[52] U.S. Cl. .......................... 438/435; 438/692; 438/437; 148/DIG. 50
[58] Field of Search ..................... 438/424, 435, 438/437, 692; 148/DIG. 50

[56] References Cited

U.S. PATENT DOCUMENTS

| | | |
|---|---|---|
| 5,244,827 | 9/1993 | Dixit et al. ....................... 148/DIG. 50 |
| 5,518,950 | 5/1996 | Ibok et al. ............................... 438/435 |
| 5,837,612 | 11/1998 | Ajuria et al. ............................ 438/425 |
| 5,925,575 | 7/1999 | Tao et al. ................................ 438/692 |

*Primary Examiner*—Trung Dang
*Attorney, Agent, or Firm*—Bacon & Thomas

[57] ABSTRACT

A method of fabricating trench isolation is disclosed: firstly, the areas of trench isolation are formed on a silicon substrate, and then filled by depositing an oxide layer. Secondly, a process of planarization is performed to remove the extra oxide. After that, a layer of photo resist is coated and patterned, such that the areas of trench isolation are protected by the layer of photo resist. The oxide protected by the photo resist is not removed by the subsequent etching process. During the process of stripping the photo resist, the oxide at the edges of the areas of trench isolation will be also rounded and no more in the shape of right angle. Therefore, the kink effect in the prior arts is no more existent. Thereafter, a gate oxide layer and a polysilicon layer are formed in sequence. The trench isolation according to the present invention is thus accomplished.

16 Claims, 5 Drawing Sheets

METHOD OF FABRICATING TRENCH ISOLATION FOR IC MANUFACTURE

BACKGROUND OF THE INVENTION

(1) Field of the Invention

The present invention relates to a method of fabricating trench isolation, and more particularly to a process for fabricating trench isolation to solve the issue of kink effect.

(2) Description of the Related Art

In recent years, the sizes of the MOSFETs and capacitors have become continuously smaller so that the packing densities of these ICs have increased considerable. It is necessary to isolate all of the transistors in order to prevent the transistors affecting one another. At the early stage, the method of Local Oxidation (LOCOS) was used as the isolation process. The method of LOCOS uses thermal oxidation to form a field oxide layer to isolate all of the transistor. To use LOCOS as isolation process has a serious drawback—bird's beak. The bird's beak, the lateral extension of field oxide during thermal oxidation process, will affect the subsequent process at the active regions. This issue is getting serious in the field of sub-micron and deep sub-micron technology. Therefore, a lot of new isolation processes were developed to substitute the method of LOCOS.

Trench isolation is the first candidate to substitute LOCOS. FIG. 1 is a layout diagram with trench isolation, including gate (G), source (S), and drain (D). FIG. 2 schematically illustrates the cross section of FIG. 1 in the direction of AA. Referring now to FIG. 2A, areas of trench isolation 200 are formed on a silicon substrate 1 by the method of photolithography and etching, and then the areas of trench isolation 200 are filled by depositing an oxide layer 2. After that, a process of planarization is performed to remove the extra oxide.

Referring now to FIG. 2B, the surface of the oxide at the areas of trench isolation is lower than the surface of the oxide on the substrate. After the process of planarization to remove the extra oxide, the oxide at the edges of the active regions 500 is totally removed. As a result, the edges of the active regions 500 are no more covered by oxide. Because the edges of the active regions are in the shape of right angle, their radius of curvature is very small. Therefore, the surface energy at the edges is very high, and it's difficult to form a thin film at the edges. During the subsequent process of thermal oxidation to form the gate oxide at the active regions, the thickness of the gate oxide 100 at the corners will be much less than that at the active regions. Consequently, the kink effect will happen at the resulting transistors. The so-called kink effect is a phenomenon of a transistor turning on abnormally, and thus affects the performance and the yield of ICs.

In some prior arts, an oxide layer and a nitride layer are formed as a hard mask to protect the active regions before defining the areas of trench isolation [don't show in FIG. 2 (please refer to J. M. Boyd & J. P. Ellul, J. Electrochem. Soc., 143(11), 3718(1996) for more details)]. The nitride layer is performed as a stop layer, in order to prevent removing too much oxide 2a at the areas of trench isolation during the process of etching oxide 2 back. However, the oxide 2a will also be attacked during the subsequent process of removing the nitride layer. As a result, the edges of the active regions are no more covered by oxide, and are thus in the shape of right angle.

Therefore, the present invention discloses an easy and manufacturable method to fabricate trench isolation for high density IC applications.

SUMMARY OF THE INVENTION

According, it is a primary object of the present invention to provide an easy and manufacturable method to fabricate trench isolation for high density IC applications.

It is another object of the present invention to provide trench isolation for the free kick effect.

These objects are accomplished by the fabrication process described below. Firstly, the areas of trench isolation are formed on a silicon substrate, and then filled by depositing an oxide layer. Secondly, a process of planarization is performed to remove the extra oxide. After that, a layer of photo resist is coated and patterned, such that the areas of trench isolation are protected by the layer of photo resist. The oxide protected by the photo resist will not be removed by the subsequent etching process. During the process of stripping the photo resist, the oxide at the edges of the areas of trench isolation will also be rounded and no more in the shape of right angle. Therefore, the kink effect in the prior arts is no more existent. Thereafter, a layer of gate oxide and a layer of polysilicon are formed in sequence. The trench isolation according to the present invention is thus accomplished.

BRIEF DESCRIPTION OF THE DRAWINGS

The accompanying drawings forming a material part of this description, in which:

FIGS. 2A to 5C schematically illustrate the cross section of FIG. 1 in the direction of AA.

FIGS. 2A to 2B are cross sectional representation of trench isolation according to the prior art.

FIGS. 3A to 3C are cross sectional representation of trench isolation according to the first embodiment of the present invention.

FIGS. 4A to 4D are cross sectional representation of trench isolation according to the second embodiment of the present invention.

FIGS. 5A to 5C are cross sectional representation of trench isolation according to the third embodiment of the present invention.

DESCRIPTION OF THE PREFERRED EMBODIMENT

First Embodiment

Figure 1:
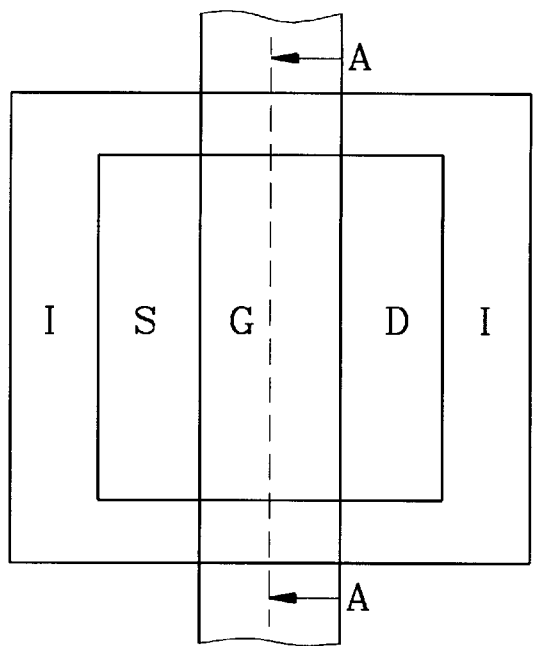
FIG. 1 schematically illustrates the layout diagram of trench isolation in IC fabrication.
Figure 2:
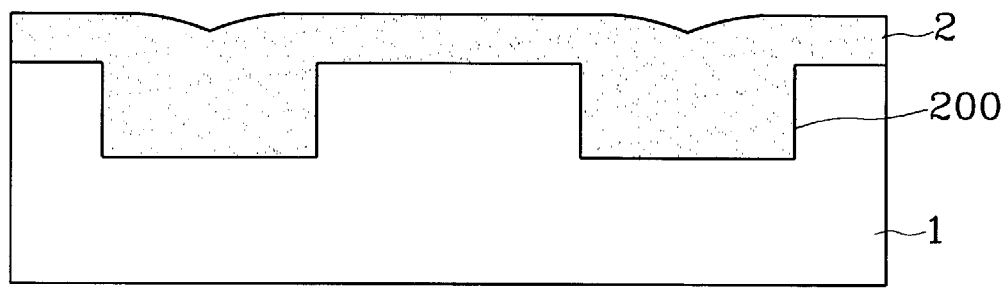
Figure 2:
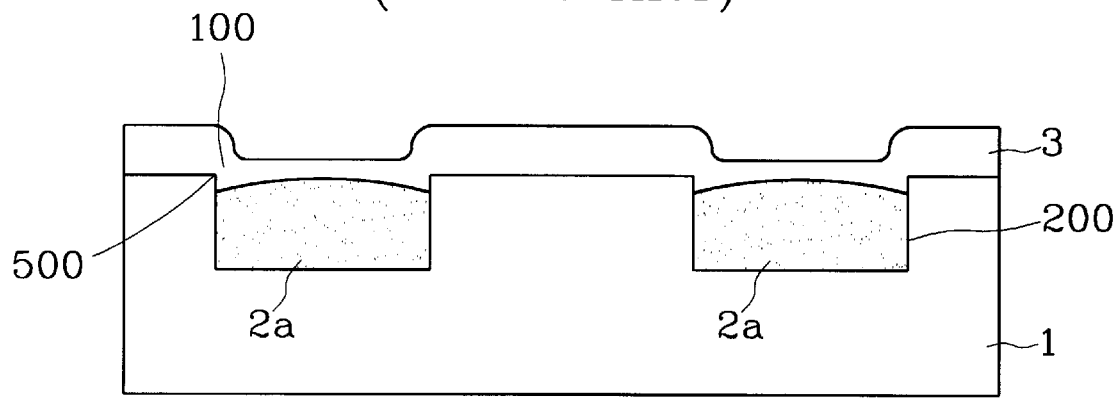

The invention disclosed herein is directed to a method of fabricating trench isolation of ICs. The drawing figures are illustrated a partially completed integrated circuit device. In the following description, numerous details are set forth in order to provide a thorough understanding of the present invention. One skilled in the art will appreciate that variations of these specific details are possible while still achieving the results of the present invention. In other instance, well-known processing steps are not described in detail in order not unnecessarily to obscure the present invention.

Figure 3:
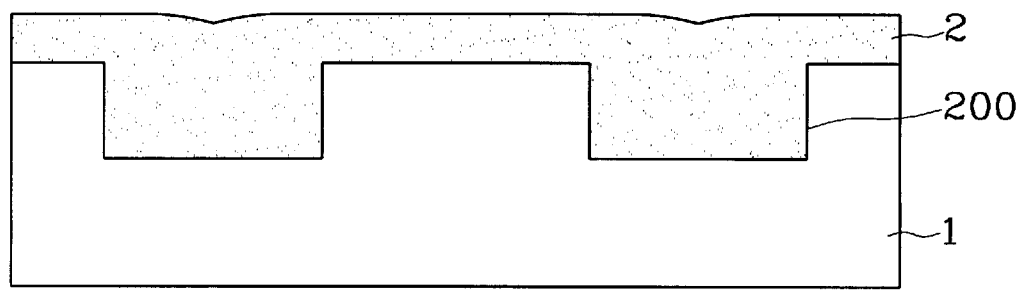
Figure 3:
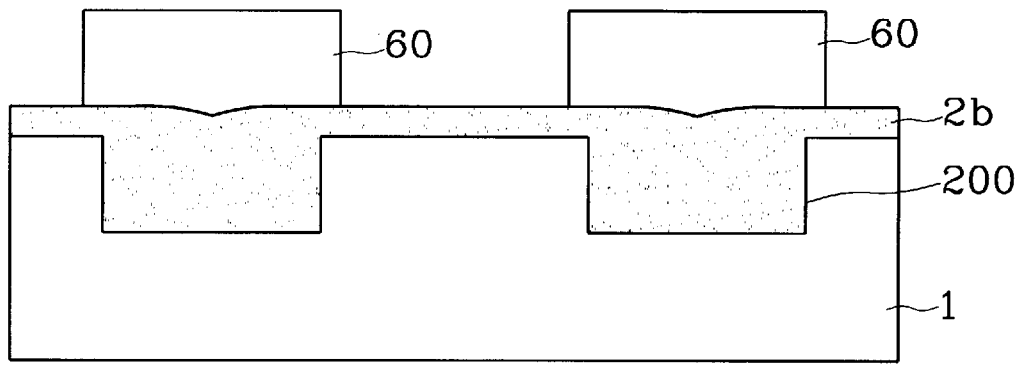
Figure 3:
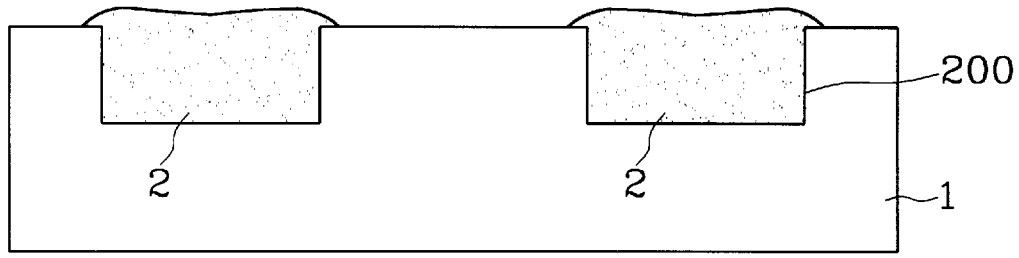

Referring now to FIG. 3A, areas of trench isolation 200 are formed on a silicon substrate 1 by the method of photolithography and etching, and then the areas of trench isolation 200 are filled by depositing an oxide layer 2. The oxide layer 2 is deposited by the method of chemical vapor deposition (CVD). The follows is the key point of the present invention. As shown in FIG. 3B, a process of chemical mechanical polishing (CMP) is performed to remove the extra oxide. Particularly, the CMP process is performed only to remove a part of the oxide layer, such that the surface of the oxide layer at the areas of trench isolation will be a little bit higher than the substrate surface. After that, a layer of photo resist is coated and patterned by photolithography, such that the areas of trench isolation are protected by the layer of photo resist 60. The oxide not protected by the photo resist 60 is then removed by the method of etching, as shown in FIG. 3C. Thereafter, the photo resist 60 is striped by the mixture of $H_2SO_4$ and $H_2O_2$. The areas protected by the photo resist 60 are a little bit wider than the actual width of the areas of trench isolation, such that the remanding oxide covers the corners of areas of trench isolation. As a result, the subsequent gate oxide has no difficulty to be formed at the edges of trench isolation. There is no more the kink effect occurred in the prior art, even if there is no nitride layer as a stop layer.

Second Embodiment

Using the second embodiment could also operate the present invention. The same indication numbers on the drawing figures are used to represent the same levels with those in the first embodiment.

Figure 4:
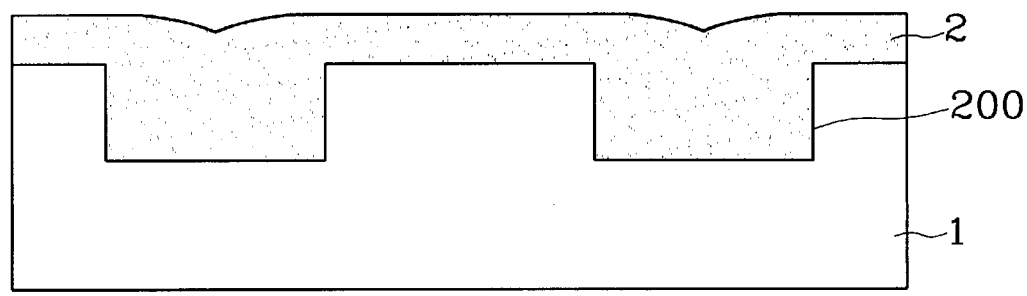
Figure 4:
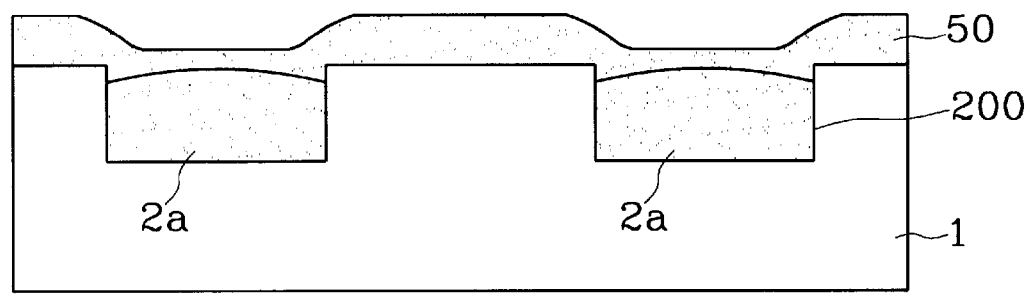
Figure 4:
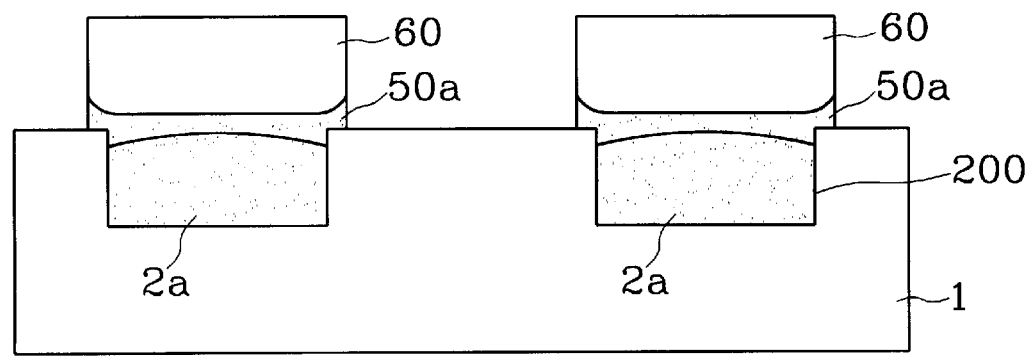
Figure 4:
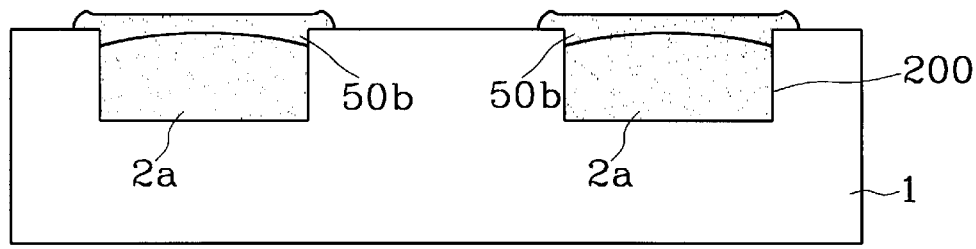

Referring now to FIG. 4A, areas of trench isolation 200 are formed on a silicon substrate 1 by the method of photolithography and etching, and then the areas of trench isolation 200 are filled by depositing an oxide layer 2. According to the prior art, a process of chemical mechanical polishing (CMP) is then used to totally remove the extra oxide above the substrate surface. As a result, the remanding oxide 2a at the areas of trench isolation will be lower than the substrate surface, as shown in FIG. 4B. Consequently, the edges of the areas of trench isolation will be no more covered by oxide, and thus the subsequent gate oxide is hard to be formed at the edges. Therefore, a kink effect occurs in the prior art. In order to overcome this issue, a second oxide layer 50 is then deposited, such that the surface of the oxide layer is a little higher than the substrate surface. Thereafter, the same with the process in the first embodiment, a layer of photo resist is coated and patterned by photolithography, such that the areas of trench isolation are protected by the layer of photo resist 60. The oxide not protected by the photo resist 60 is then removed by the method of etching, as shown in FIG. 3C. The areas protected by the photo resist 60 are a little bit wider than the actual width of the areas of trench isolation, such that the remanding oxide 2a & 50b cover the corners of areas of trench isolation. As a result, the subsequent gate oxide has no difficulty to be formed at the edges of trench isolation.

The key point of the present invention is to form the second oxide layer, such that a thicker oxide will be formed at the areas of trench isolation. The kink effect due to the remanding oxide after CMP being lower than the substrate surface in the prior art is then overcome.

The first oxide layer is formed by using the method of chemical vapor deposition (CVD). The second oxide layer can be also formed by CVD, or formed by the method of thermal oxidation. The areas of trench isolation 200 are protected by the photo resist 60, such that the oxide at those areas will not be etched during the subsequent etching process. Therefore, the surface of the oxide layer at the areas of trench isolation will be a little bit higher than that of the substrate, as shown in FIG. 4D. The edges of the remanding oxide will be rounded during the photo resist being stripped. As a result, the edges of the remanding oxide will be no more in the shape of right angle, and the surface energy will be much lower. There is no more the kink effect occurred in the prior art, even if there is no a nitride layer as an etching stop layer. The photo resist is striped by the mixture of $H_2SO_4$ and $H_2O_2$. After that, following the process of gate oxide growth and the other processes, a normal transistor can be formed.

In addition, a nitride layer can be formed before the process of photolithography as the stop layer of CMP process. Before the process of gate oxide growth, to strip the nitride layer by using $H_3PO_4$ is needed.

Third Embodiment

Using the third embodiment could also operate the present invention. The same indication numbers on the drawing figures are used to represent the same levels with those in the first and the second embodiments.

Figure 5:
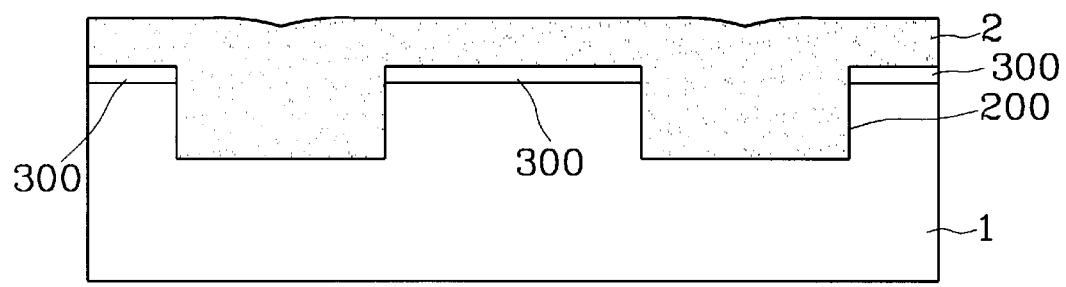
Figure 5:
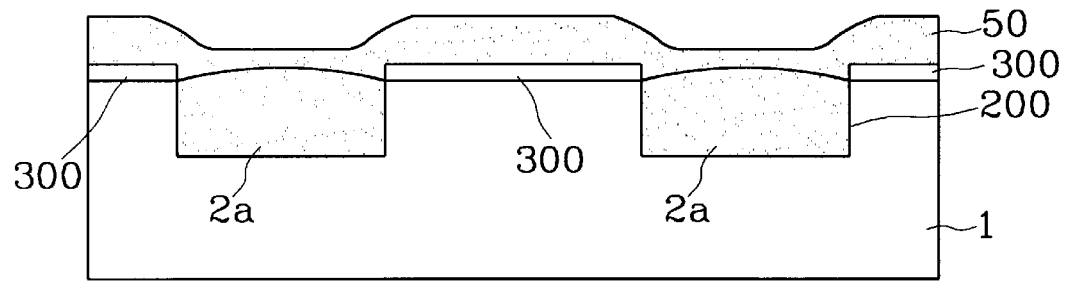
Figure 5:
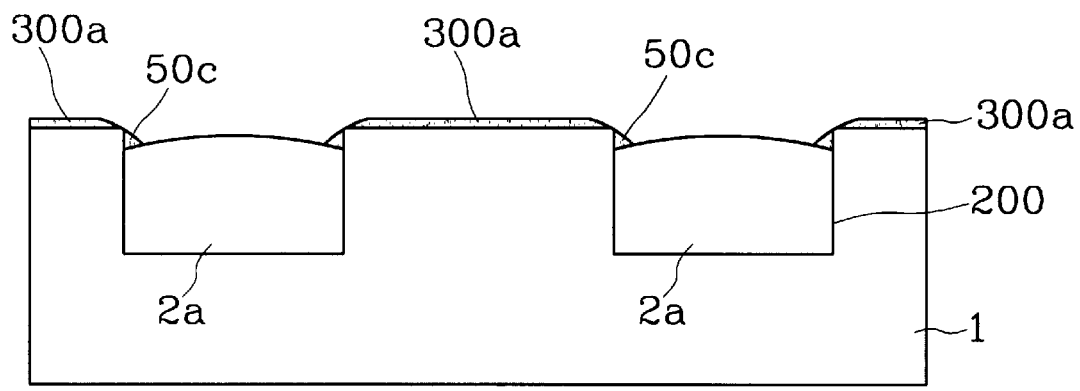

Referring now to FIG. 5A, a nitride layer 300 is deposited on a substrate 1 as a stop layer. Thereafter, areas of trench isolation 200 are formed on the silicon substrate 1 by the method of photolithography and etching, and then the areas of trench isolation 200 are filled by depositing a first oxide layer 2. Referring now to FIG. 5B and 5C, a process of CMP the same with the prior art is performed to remove the extra oxide. As shown in FIG. 5B, the surface of the oxide at the areas of trench isolation is lower than that of the substrate.

Above the remanding first oxide layer 2a, the key point of this embodiment is to deposit a second oxide layer 50 on the whole substrate and then to etch it back. In the prior art, the edges of the areas of trench isolation are in the shape of right angle, such that it is difficult to form a layer of gate oxide at the corners. In present invention, however, an isotropic etching process with etching ratio 1:1 between nitride and oxide is used to etch the oxide back. As a result, a rounded oxide 50c is formed at the edges of the areas of trench isolation. Consequently, the subsequent gate oxide will be much more uniform than the prior arts.

The nitride layer is formed by using the method of low-pressure chemical vapor deposition (LPCVD). The first oxide layer is formed by CVD, and the second oxide layer is formed by CVD or by the method of thermal oxidation. The etching process for the nitride layer and the oxide layer uses isotropic etching process.

The method for forming trench isolation according to this invention has the following advantages:

1. The process for trench isolation in present invention doesn't affect the subsequent processes in the active regions.
2. The resulting transistors in the active regions will have no kink effect, when the trench isolation is formed by using the present invention.

While the invention has been particularly shown and described with reference to a preferred embodiment, it will be understood by those skilled in the art that various changes in form and detail may be made therein without departing from the spirit and scope of the present invention.

What we claimed is:

1. A method of fabricating trench isolation for IC manufacture, said method comprising the steps of:
   (a) providing a semiconductor substrate, and then forming areas of trench isolation on said semiconductor substrate;
   (b) forming an oxide layer on said semiconductor substrate to fill said areas of trench isolation, and then performing a process of planarization such that the surface of said oxide layer is higher than the surface of said semiconductor substrate;

(c) forming a photo resist pattern to protect said oxide layer at said areas of trench isolation, wherein said photo resist pattern is a little wider than said areas of trench isolation;

(d) removing said oxide layer not protected by said photo resist pattern on said semiconductor; and (e) removing said photo resist pattern.

2. The method of claim 1, wherein said oxide layer is formed by chemical vapor deposition (CVD).

3. The method of claim 1, wherein said process of planarization is by using the method of chemical mechanical polishing (CMP).

4. A method of fabricating trench isolation for IC manufacture, said method comprising the steps of:

(a) providing a semiconductor substrate, and then forming areas of trench isolation on said semiconductor substrate;

(b) forming an oxide layer on said semiconductor substrate to fill said areas of trench isolation, and then performing a process of planarization to remove said oxide layer above said semiconductor substrate, such that the surface of said oxide layer at said areas of trench isolation is lower than the surface of said semiconductor substrate;

(c) forming a second oxide layer on said semiconductor substrate;

(d) forming a photo resist pattern to protect said second oxide layer at said areas of trench isolation, wherein said photo resist pattern is wider than said areas of trench isolation;

(e) removing said second oxide layer not protected by said photo resist pattern on said semiconductor; and (f) removing said photo resist pattern.

5. The method of claim 4, wherein said oxide layer in Step (b) is formed by chemical vapor deposition (CVD).

6. The method of claim 4, wherein said process of planarization is by using the method of chemical mechanical polishing (CMP).

7. The method of claim 4, a nitride layer is formed as stop layer of CMP before Step (b).

8. The method of claim 7, wherein said nitride layer is removed after Step (f).

9. The method of claim 8, wherein said nitride layer is removed by $H_3PO_4$.

10. A method of fabricating trench isolation for IC manufacture, said method comprising the steps of:

(a) providing a semiconductor substrate, and then forming a stop layer on said semiconductor substrate;

(b) forming areas of trench isolation on said semiconductor substrate;

(c) forming a first oxide layer on said semiconductor substrate to fill said areas of trench isolation, and then performing a process of planarization to remove said first oxide layer above said semiconductor substrate, such that the surface of said first oxide layer at said areas of trench isolation are lower than that of said stop layer; and (d) forming a second oxide layer on said semiconductor substrate, then etching said second oxide layer and said stop layer back.

11. The method of claim 10, wherein said first oxide layer is formed by chemical vapor deposition (CVD).

12. The method of claim 10, wherein said process of planarization is by using the method of chemical mechanical polishing (CMP).

13. The method of claim 10, wherein the process of said etching back in Step (d) is performed by using isotropic etching.

14. The method of claim 10, wherein the process of said etching back in Step (d) has etching ratio 1:1 between said stop layer and said second oxide layer.

15. The method of claim 10, wherein said stop layer is nitride.

16. The method of claim 15, wherein said nitride is formed by using low pressure chemical vapor deposition (LPCVD).

* * * * *